(12) United States Patent
Aso

(10) Patent No.: US 10,236,399 B2
(45) Date of Patent: Mar. 19, 2019

(54) METHOD OF MANUFACTURING A SEMICONDUCTOR DEVICE

(71) Applicant: SII Semiconductor Corporation, Chiba-shi, Chiba (JP)

(72) Inventor: Tatsuya Aso, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 15/671,430

(22) Filed: Aug. 8, 2017

(65) Prior Publication Data
US 2018/0047858 A1 Feb. 15, 2018

(30) Foreign Application Priority Data

Aug. 9, 2016 (JP) ................... 2016-156829
Jun. 23, 2017 (JP) ................... 2017-123176

(51) Int. Cl.
| | |
|---|---|
| H01L 21/04 | (2006.01) |
| H01L 21/70 | (2006.01) |
| H01L 27/12 | (2006.01) |
| H01L 31/02 | (2006.01) |
| H01L 27/144 | (2006.01) |
| H01L 31/024 | (2014.01) |
| H01L 31/028 | (2006.01) |
| H01L 31/103 | (2006.01) |
| H01L 31/0203 | (2014.01) |

(52) U.S. Cl.
CPC ...... H01L 31/0284 (2013.01); H01L 21/0455 (2013.01); H01L 21/70 (2013.01); H01L 27/1203 (2013.01); H01L 27/1443 (2013.01); H01L 31/0203 (2013.01); H01L 31/024 (2013.01); H01L 31/02024 (2013.01); H01L 31/103 (2013.01)

(58) Field of Classification Search
CPC ................. H01L 27/0635; H01L 21/2255
See application file for complete search history.

(56) References Cited

U.S. PATENT DOCUMENTS

| | | | | |
|---|---|---|---|---|
| 3,765,963 A * | 10/1973 | Okabe | ........ | H01L 21/00 257/E21.149 |
| 4,370,180 A * | 1/1983 | Azuma | ........ | H01L 21/221 257/E21.137 |
| 2011/0309333 A1* | 12/2011 | Cheng | ........ | B82Y 10/00 257/24 |
| 2014/0097510 A1 | 4/2014 | Sugawa et al. | | |

FOREIGN PATENT DOCUMENTS

| | | |
|---|---|---|
| JP | 2014-154793 A | 8/2014 |
| JP | 5692880 B2 | 4/2015 |

* cited by examiner

*Primary Examiner* — Moazzam Hossain
*Assistant Examiner* — Stanetta D Isaac
(74) *Attorney, Agent, or Firm* — Brinks Gilson & Lione

(57) ABSTRACT

Provided is a method of manufacturing a semiconductor device having a photodiode that has a shallow p-n junction and thus achieves high sensitivity to an ultraviolet ray, in which an oxide containing impurities at high concentration is deposited on the surface of the silicon substrate, and thereafter a diffusion region is formed to have a shallow junction by performing thermal diffusion of a rapid temperature change, with the use of a high-speed temperature rising and falling apparatus without using ion implantation into the silicon substrate.

12 Claims, 9 Drawing Sheets

METHOD OF MANUFACTURING A SEMICONDUCTOR DEVICE

RELATED APPLICATIONS

This application claims priority under 35 U.S.C. § 119 to Japanese Patent Applications No. 2016-156829 filed on Aug. 9, 2016 and No. 2017-123176 filed on Jun. 23, 2017, the entire content of which are hereby incorporated by reference.

BACKGROUND OF THE INVENTION

1. Field of the Invention

The present invention relates to a method of manufacturing a semiconductor device having a photodiode which utilizes a p-n junction for detecting ultraviolet rays.

2. Description of the Related Art

There are various types of semiconductor light receiving elements with which a semiconductor device is formed. In particular, a light receiving element including a photodiode having a p-n junction of silicon is used in many applications since all processes from light receiving to signal processing can be conducted on one chip by forming an integrated circuit including the photodiode and MOS transistors or the like on the same substrate. However, a penetration depth of light in silicon (a depth at which an intensity of the incident light to the silicon is attenuated to 1/e where "e" is Napier's constant, which is 2.71828 . . . due to absorption) has a wavelength dependence, as shown in FIG. 3. Thus, in a case of an ultraviolet ray (UVA: from 320 nm to 400 nm, and UVB: from 280 nm to 320 nm), most of the light is absorbed in the range extending from several nanometers to several tens of nanometers. Structures for detecting the ultraviolet ray using silicon, which has such features, are disclosed in Japanese Patent No. 5692880.

Specifically, in order to detect, as a photocurrent, an electron-hole pair generated through irradiation of the ultraviolet ray, the depth of the p-n junction of the photodiode is made as shallow as in the range between several tens of nanometers to one hundred nanometers. Further, having an impurity profile in which an impurity concentration at the outermost surface of the silicon substrate is set to be high as $10^{19}$ cm$^{-3}$ or more and in which the concentration gradually decreases along the depth direction, an electric field emerges due to the concentration gradient, which helps effective separation of the electron-hole pair, permitting acquisition of the photocurrent.

In such a photodiode structure using the silicon, when charges are trapped in an insulating film formed on silicon due to the irradiation of the ultraviolet ray, there is a concern that the band structure of the p-n junction may be affected such that sensitivity characteristics of the photodiode change. The high impurity concentration at the outermost surface of the silicon substrate, as explained before, has an advantage in that an influence of fixed charges in the insulating film is shielded.

Hitherto, when impurities are introduced by ion implantation, ion implantation is performed after an oxide film is formed on the surface of silicon by thermal oxidation or deposition so that damage due to the implantation is prevented. In addition, heat treatment is performed for the purposes of stabilization of implanted ions and recovery of crystal structure. The heat treatment is performed at high temperature (for example, 900° C.), and hence even when a shallow junction is formed by the ion implantation, the impurities are diffused to form a deeper junction by the heat treatment. The heat treatment is not necessarily performed, but when the damage due to the ion implantation is not recovered, there arises a concern that an obtained UV sensor does not have good sensitivity to UV rays.

SUMMARY OF THE INVENTION

In view of the foregoing, it is an object of the present invention to provide a method of manufacturing a semiconductor device including a photodiode having a junction whose depth is needed to detect ultraviolet rays with high sensitivity.

According to one embodiment of the present invention, there is provided a method of manufacturing a semiconductor device comprising a photodiode using a p-n junction in a surface of a silicon substrate, the method comprising:

removing an oxide film formed on the surface of the silicon substrate;

depositing a first oxide containing phosphorus on the surface of the silicon substrate;

forming the first oxide only in a desired part;

forming a first n-type diffusion region by performing a first annealing on the first oxide formed only in the desired part at a high temperature of 1,000° C. or more for 3 minutes or less, to thereby thermally diffuse the phosphorus contained in the first oxide into the surface of the silicon substrate;

depositing a second oxide containing phosphorus on the surface of the silicon substrate after removing the first oxide formed only in the desired part;

forming the second oxide so that the second oxide is connected to the first n-type diffusion region; and forming a second n-type diffusion region by performing a second annealing on the second oxide at a temperature equal to or higher than that of the first annealing for a time equal to or shorter than that of the first annealing, to thereby thermally diffuse the phosphorus contained in the second oxide into the surface of the silicon substrate.

According to the present invention, a photodiode having a diffusion depth which is able to detect UV rays sensitively and which is disable to obtain by the implantation of ions into a silicon substrate can be formed on the surface of a silicon substrate.

BRIEF DESCRIPTION OF THE DRAWINGS

FIG. 5A, FIG. 5B, and FIG. 5C are cross-sectional schematic diagrams for illustrating the method of manufacturing a semiconductor device of the second embodiment, in which FIG. 5A is subsequent to FIG. 4C.

FIG. 6A, FIG. 6B, and FIG. 6C are cross-sectional schematic diagrams for illustrating a method of manufacturing a semiconductor device according to a third embodiment of the present invention, in which FIG. 6A is subsequent to FIG. 5A.

DETAILED DESCRIPTION OF THE PREFERRED EMBODIMENTS

Figure 1A:
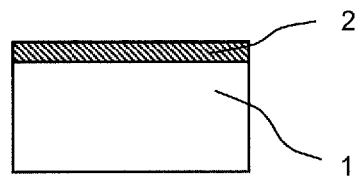
FIG. 1A, FIG. 1B, FIG. 1C, FIG. 1D, FIG. 1E, and FIG. 1F are diagrams for illustrating a method of manufacturing a semiconductor device according to a first embodiment of the present invention in the order of manufacturing.

FIG. 1A to FIG. 1F are illustrations of a first embodiment of the present invention in which manufacturing method of a semiconductor device is shown in the order of manufacturing. As illustrated in FIG. 1A, as pretreatment of depositing impurities on the surface of a p-type silicon substrate 1, the surface of the silicon substrate is cleaned to remove a natural oxide film 2. Thus, no oxide film exists on the surface of the silicon substrate 1 when the first oxide containing dopant is deposited by CVD thereafter. If the natural oxide film 2 exists on the surface of the silicon substrate 1, the natural oxide film 2 prevents thermal diffusion of the dopant from the first oxide containing dopant.

Figure 1B:
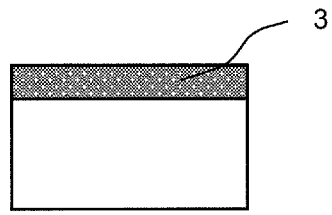

Next, as illustrated in FIG. 1B, the first oxide 3 containing n-type impurities at high concentration is deposited on the entire surface of the silicon substrate 1 by CVD. Here, a silicon oxide containing phosphorus is deposited by 0.1 μm, for example. The concentration of phosphorus is set to $10^{19}$ $cm^{-3}$ or more. The deposition by CVD takes about 30 minutes at a reaction temperature of 600° C. The deposited first oxide 3 contains dopant diffused into the silicon substrate, and is not necessarily thin but may be deposited sufficiently.

Figure 1C:
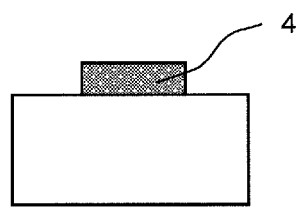

Subsequently, as illustrated in FIG. 1C, unnecessary part of the deposited first oxide 3 is removed by patterning and etching using a resist so that the first oxide 4 remains only in a desired part of the light receiving element region.

Figure 1D:
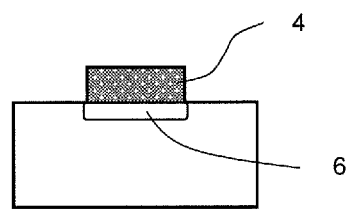

Next, as illustrated in FIG. 1D, under a state in which the first oxide 4 remains only in the desired part of the light receiving element region, the first high-speed annealing is performed at a high temperature of 1,000° C. or more for a short time of 3 minutes or less with the use of a high-speed temperature rising and falling apparatus, which is used in a rapid thermal process (RTP), diffusing the phosphorus contained in the first oxide 4 into the surface of the silicon substrate 1. (Hereafter annealing by a high-speed temperature rising and falling apparatus used in a RTP is called high-speed annealing.) Specifically, the temperature of the first high-speed annealing is 1,000° C. and the time is a minute and a half, for example. The first n-type diffusion region 6 is thereby formed in the vicinity of the surface of the silicon substrate 1.

After the formation of the first n-type diffusion region 6 on the surface of the first silicon substrate 1 by diffusion, the first oxide 4 deposited on the surface of the silicon substrate is removed so that no residue remains.

Though a shallow p-n junction having a diffusion depth not deeper than 100 nanometers can be obtained by a single diffusion for forming the first diffusion region, the second diffusion region having a higher impurity concentration and a shallower diffusion depth than those of the first diffusion region is formed to further increase the impurity concentration of the outermost surface of the silicon substrate 1. Hence steps similar to those illustrated in FIG. 1B and FIG. 1C are repeated. Specifically, the second oxide containing n-type impurities at high concentration is deposited again on the whole surface of the silicon substrate 1 by CVD. Here, a silicon oxide containing phosphorus is deposited by 0.1 μm, for example. The concentration of phosphorus is set higher than that of the first oxide to be $5 \times 10^{19}$ $cm^{-3}$ or more. The deposition by CVD takes about 30 minutes at a reaction temperature of 600° C.

Figure 1E:
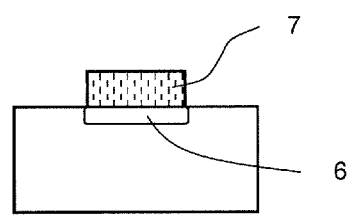

Next, as illustrated in FIG. 1E, the second oxide 7 containing n-type impurities at high concentration is formed to connect to the first oxide 4, which is already formed, by patterning and etching. Then, the second high-speed annealing is performed at a temperature equal to or higher than that of the first high-speed annealing for a time equal to or shorter than that of the first high-speed annealing. Specifically, the temperature and time of the second high-speed annealing are 1,000° C. and 2 seconds respectively, for example.

Figure 1F:
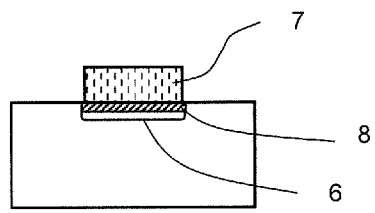

In this way, as illustrated in FIG. 1F, the second n-type diffusion region 8 having a shallow diffusion length is formed on the surface of the first diffusion region 6. The first diffusion region and the second diffusion region are overlapped in a plan view, forming a cathode region of the photodiode. According to a manufacturing process shown above a p-n junction for a photodiode can be formed in a desired light receiving element region.

Figure 2:
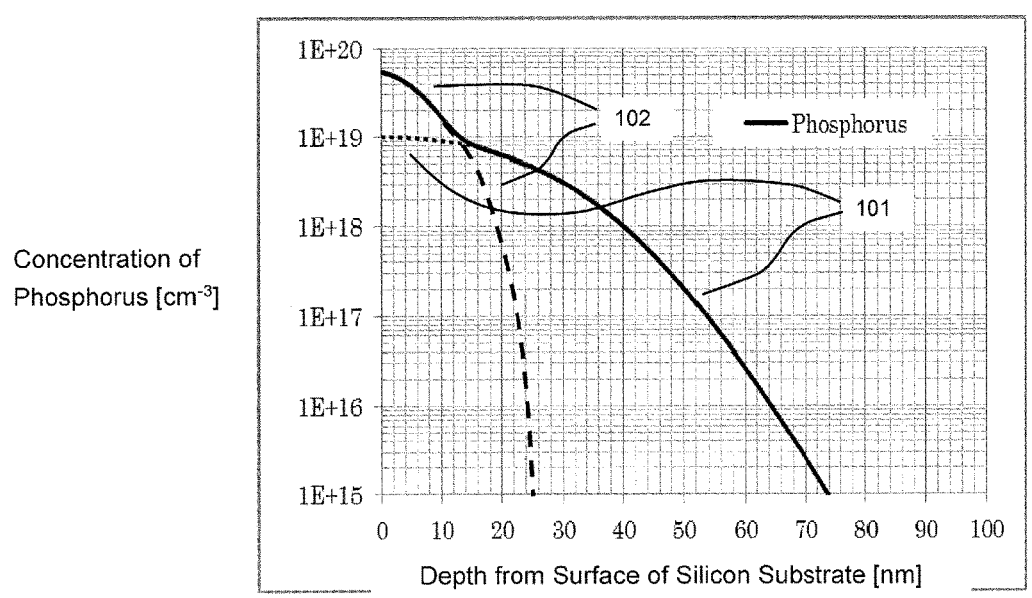
FIG. 2 is a concentration profile of phosphorus after heat treatment is performed twice.
Figure 3:
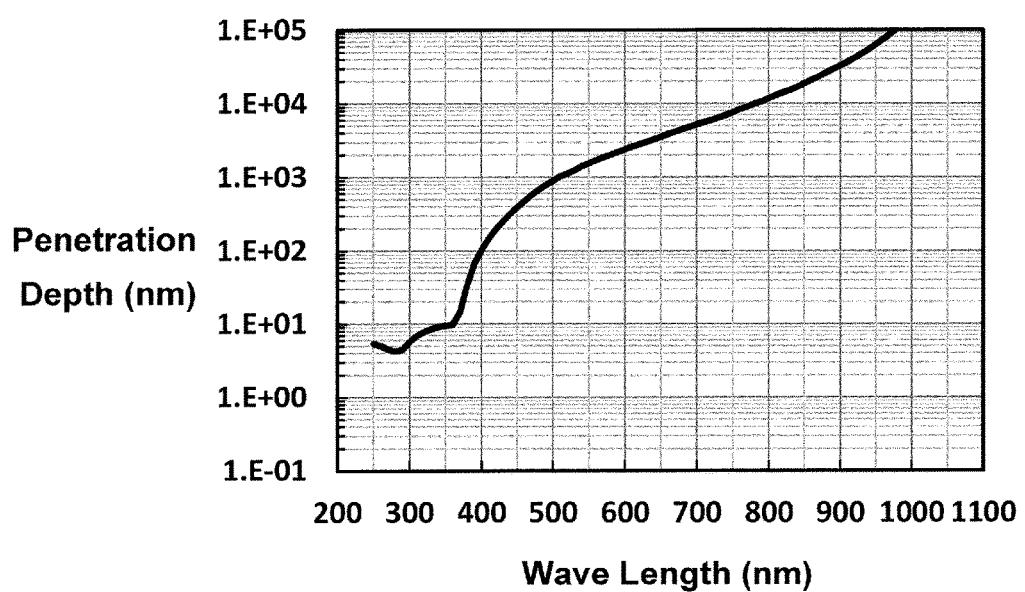
FIG. 3 is a graph for showing the wavelength dependence of a penetration depth of light entering silicon.

FIG. 2 is a concentration profile of phosphorus along the depth direction in a light receiving element region that is formed by the manufacturing method of the first embodiment. The first impurity distribution corresponding to the first n-type diffusion region 6 having a concentration profile denoted by a curve 101 in FIG. 2 is substantially formed after the first high-speed annealing. The surface concentration of the first impurity distribution 101 is about $10^{19}$ $cm^{-3}$ and the depth at which the concentration of phosphorus reaches $10^{15}$ $cm^{-3}$ is 74 nanometers. Though the concentration profile curve 101 seems to be gentle, the junction has a depth less than 100 nanometers, thereby forming a very steep concentration profile.

The second impurity distribution 102 corresponding to the second n-type diffusion region 8 is formed along the outermost surface of the silicon substrate 1 after the second high-speed annealing. The second impurity distribution 102 has a surface concentration of $5 \times 10^{19}$ $cm^{-3}$ and reaches the same concentration as that of the first impurity distribution 101, which was formed in advance, at a depth of 14 nanometers, having a concentration profile which falls abruptly beyond 14 nanometers inward. The final concentration profile is accordingly a sum of the first impurity distribution 101 and the second impurity distribution 102, which is shown by the curve drawn by solid line in FIG. 2. The shape of the curve has a step along the way since a high concentration region only exists in the vicinity of the outermost surface.

In the first embodiment, the concentration of phosphorus in the outermost surface of the silicon substrate is $5 \times 10^{19}$ $cm^{-3}$, and the depth from the surface of the silicon is 53 nm at which the concentration of phosphorus is equal to or less than the concentration of boron in the silicon substrate, namely, $10^{17}$ $cm^{-3}$, permitting achievement of an n-type high concentration impurity region having an concentration profile that is needed to detect ultraviolet rays with high sensitivity.

In Japanese Patent Application Laid-open No. 2014-154793, a gate oxide film is formed by thermal oxidation to have a thickness of from 10 nm to 50 nm, and a sidewall insulating film is deposited by TEOS to have a thickness of from 200 nm to 500 nm. Ion implantation is performed through those oxide films. Since the resulting p-n junction has a depth of about 200 nm, it is difficult to achieve a shallow junction having a depth of 100 nm or less, which is essentially needed to detect ultraviolet rays with high sensitivity. It is also difficult to set an impurity concentration at the outermost surface of the silicon substrate to $10^{19}$ cm$^{-3}$ or more. In the first embodiment a diffusion region having not only a junction depth of 100 nm or less but also an impurity concentration of $10^{19}$ cm$^{-3}$ or more at the outermost surface can be formed through diffusion of impurities into the surface of the silicon substrate in a short time of three minutes or less from an oxide which contains a high concentration impurity and is deposited on the surface of the silicon substrate.

In the manufacturing method described in the above, phosphorus is used as n-type impurities, and is thermally diffused in a repetitive manner from the oxide containing phosphorus at high concentration and deposited on the surface of the p-type silicon substrate 1 to form a shallow junction having a high concentration of phosphorus at the surface of the silicon substrate 1. The shallow junction is supposed to be applied to a photodiode capable of detecting ultraviolet rays, and the photodiode is preferably formed in the same chip as an integrated circuit or other signal processing circuits in terms of application as described in the "Description of the Related Art" section. Integrated circuits generally include MOS transistors. It is accordingly desired that the photodiode and the MOS transistor are consistently arranged in the same chip while mutual influence on the manufacturing steps is reduced as much as possible.

Now, by way of an embodiment, description is made for a method of manufacturing a photodiode that is applicable when main parts of a MOS transistor are already formed in a silicon substrate. In the following description, the term "silicon substrate" refers to a substrate made of silicon itself, and the simple term "substrate" refers to an overall structure including the silicon substrate and structures formed on the surface of the silicon substrate, or near the surface of the silicon substrate.

Figure 4A:
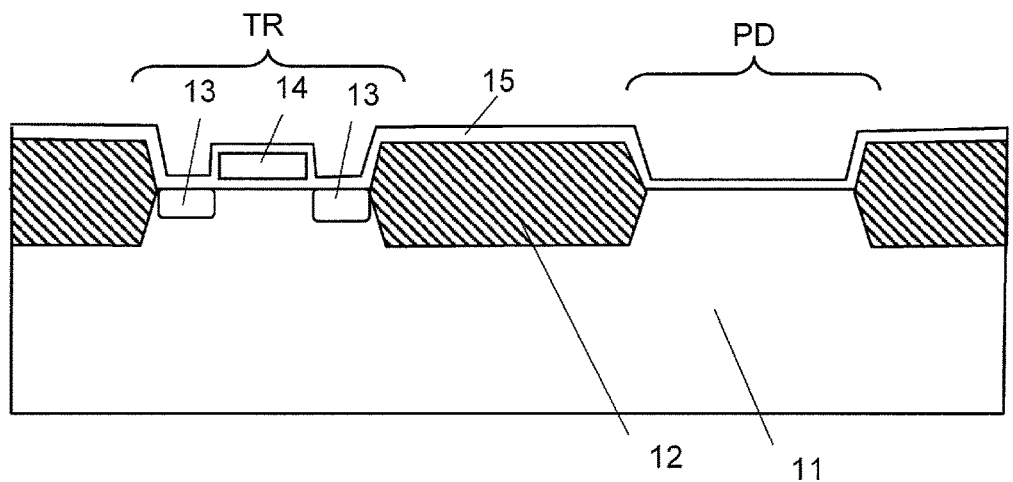
FIG. 4A, FIG. 4B, and FIG. 4C are cross-sectional schematic diagrams for illustrating a method of manufacturing a semiconductor device according to a second embodiment of the present invention in the order of steps.
Figure 4B:
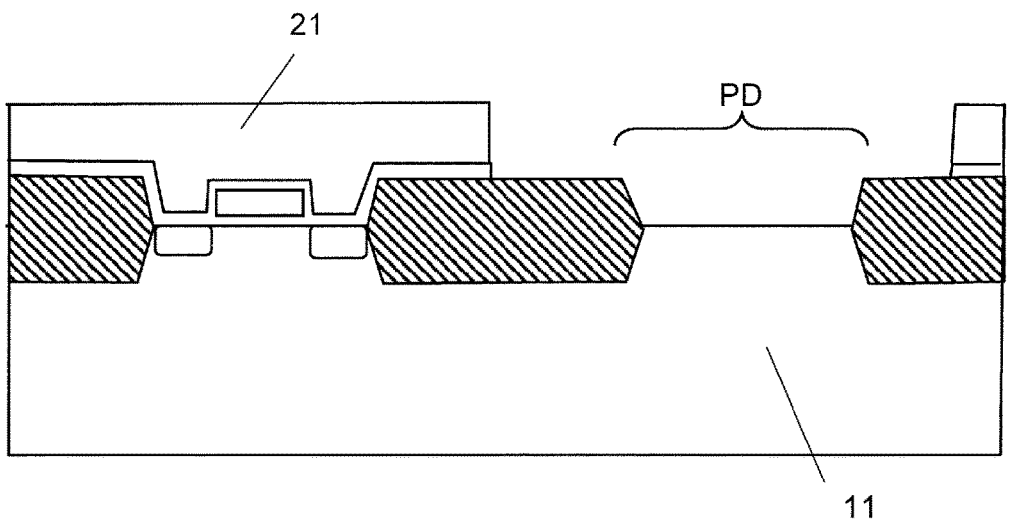
Figure 4C:
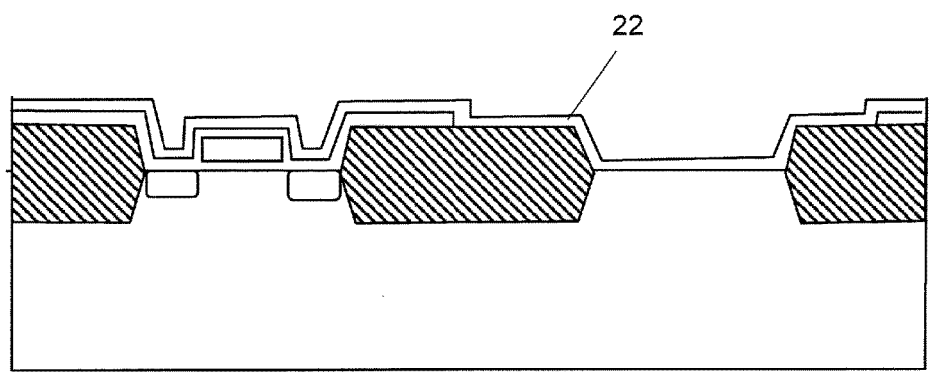

FIG. 4A to FIG. 4C are cross-sectional schematic diagrams for illustrating the representative steps of a method of manufacturing a semiconductor device including a photodiode according to a second embodiment of the present invention.

FIG. 4A is an illustration of a silicon substrate 11 in which main parts of a MOS transistor are formed. Specifically, the following are formed as the main parts of the MOS transistor near the surface of the p-type silicon substrate 11: diffusion regions 13 serving as a source and a drain, a gate electrode 14, an intermediate insulating film 15 covering the surfaces of the diffusion regions 13, which serve as the source and the drain, and the gate electrode 14. The intermediate insulating film 15 is generally a deposited film including a silicon oxide film, and covers the entire surface of the substrate.

Region in which elements are formed are divided by element isolation insulating films 12 formed on the surface of the silicon substrate 11. A region TR where a MOS transistor is formed to construct an integrated circuit and a region PD where a photodiode is formed are shown. In FIG. 4A, as the element isolation insulating film 12, a field oxide film (also called "LOCOS oxide film") is illustrated, but an oxide film used to fill a trench in shallow trench isolation may be used instead. Further, the photodiode, which is formed in the p-type silicon substrate, may be formed in a p-type well or other diffusion region.

FIG. 4B is the cross-sectional schematic diagram of a step subsequent to FIG. 4A. The surface of the substrate is covered with a patterned photoresist 21 except for the region PD to be etched and its surrounding region in order to selectively remove, by etching, the intermediate insulating film 15 deposited on the surfaces of the silicon substrate 11 and the element isolation insulating film 12 in the region PD. After that, the exposed intermediate insulating film 15 is removed by etching using the photoresist 21 as a mask. In the step including etching, the surface of the silicon substrate 11 in a region (active region) of the region PD that is not covered with the element isolation insulating film 12 is positively exposed.

FIG. 4C is the cross-sectional schematic diagram of a step subsequent to FIG. 4B, and is an illustration in which after the photoresist 21 is removed, the first oxide 22 containing phosphorus at high concentration is deposited on the entire surface of the substrate. For example, a silicon oxide containing phosphorus at high concentration is deposited by 0.1 μm. The concentration of phosphorus is set to $10^{19}$ cm$^{-3}$ or more. Required time is about 30 minutes at a reaction temperature of 600° C. The deposited the first oxide 22 is a deposition containing dopant to be diffused into the silicon substrate 11, and is not necessarily thin but may be deposited sufficiently.

Figure 5A:
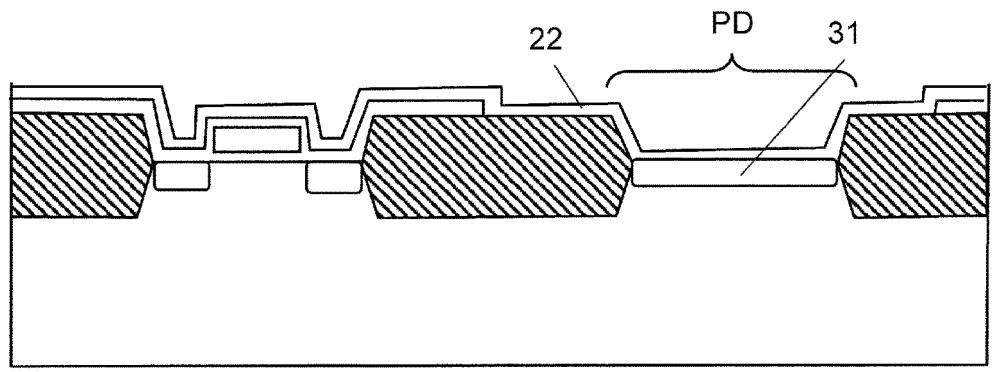
Figure 5B:
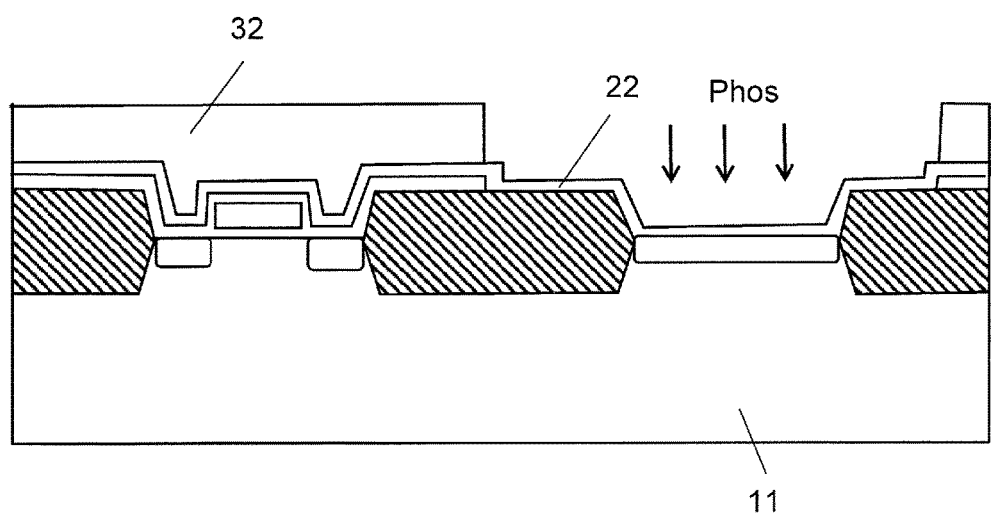
Figure 5C:
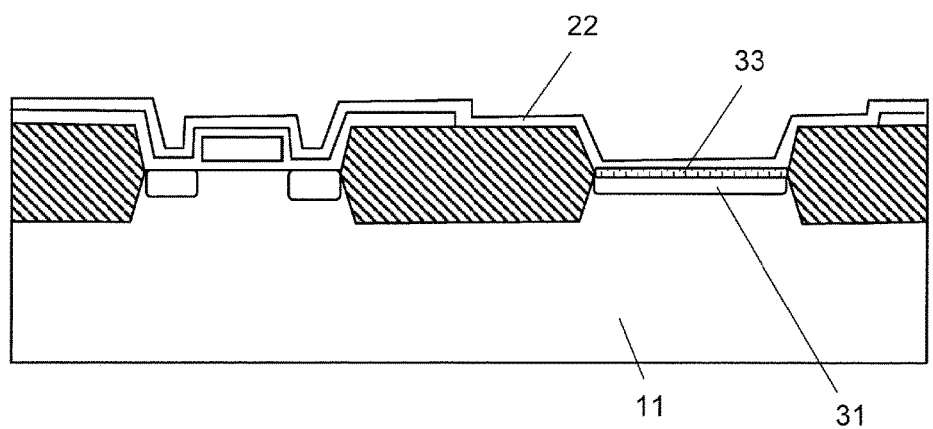

FIG. 5A to FIG. 5C are cross-sectional schematic diagrams for illustrating the representative steps of the method of manufacturing a semiconductor device including a photodiode according to the second embodiment, which are subsequent to FIG. 4A to FIG. 4C. FIG. 5A is an illustration of a step of forming a first n-type diffusion region 31 by heating the first oxide 22 containing phosphorus at high concentration, thereby diffusing the phosphorus, which is used as n-type impurities, into the surface of the silicon substrate in the region PD. The first high-speed annealing is performed at a high temperature of 1,000° C. or more for a short time of 3 minutes or less to diffuse the phosphorus. The temperature and time of the first high-speed annealing are 1,000° C. and a minute and a half, for example. The first oxide 22 containing phosphorus at high concentration covers the entire surface of the substrate, but the first oxide 22 containing phosphorus at high concentration is in direct contact only with the surface of the silicon substrate 11 in the PD region. In other regions, the intermediate insulating film 15 formed under the first oxide 22 containing phosphorus at high concentration prevents the phosphorus from being diffused, and hence no phosphorus is diffused into the silicon substrate 11.

FIG. 5B is the cross-sectional schematic diagram of a step subsequent to FIG. 5A, and is an illustration of the step of selectively introducing phosphorus into the first oxide 22 to increase the concentration of phosphorus in the first oxide 22. Similarly to FIG. 4B, the surface of the substrate is covered with a patterned photoresist 32 except for the region PD and its surrounding region in order to introduce phosphorus into the first oxide 22 in the region PD and its surrounding region by ion implantation. The phosphorus ions are selectively introduced into the first oxide 22 by performing ion implantation using the photoresist 32 as a mask under this state. The energy of ion implantation is selected depending on the thickness of the first oxide 22 so that the phosphorus ions are distributed in a region of the first oxide 22 that is close to the silicon substrate 11. The peak of the concentration of phosphorus ions in the first oxide 22 is set to 5×$10^{19}$ cm$^{-3}$ or more.

FIG. 5C is the cross-sectional schematic diagram of a step subsequent to FIG. 5B. FIG. 5C is an illustration of the step of forming a second n-type diffusion region 33 along the surface of the first n-type diffusion region 31 by diffusing phosphorus into the silicon substrate 11 from the first oxide 22 into which phosphorus ions are selectively introduced, after removing the photoresist 32. The second high-speed annealing is performed at a temperature equal to or higher than that of the first high-speed annealing for a time equal to or shorter than that of the first high-speed annealing. Specifically the temperature and the time of the second high-speed annealing are, for example, 1,000° C. and 2 seconds respectively. Hence the second n-type diffusion region 33 can be formed to have a shallow depth at the surface of the first n-type diffusion region 31. The first diffusion region 31 and the second diffusion region 33 are overlapped in a plan view, forming a cathode region of the photodiode.

Through the process described above, there can be manufactured the photodiode having a shallow junction in which the concentration of impurities is high immediately under the surface of the silicon substrate 11. In the second embodiment, the intermediate insulating film 15 formed on the surface in the region PD is removed by etching, but the deposited first oxide 22 containing phosphorus at high concentration is not removed. Thus, a reduction in film thickness accuracy due to etching can be prevented. In addition, the intermediate insulating film 15 and the first oxide 22 are not removed in the region TR, and the MOS transistor is thus less affected.

Next, description is made of a method of manufacturing a semiconductor device including a photodiode according to a third embodiment of the present invention.

Figure 6A:
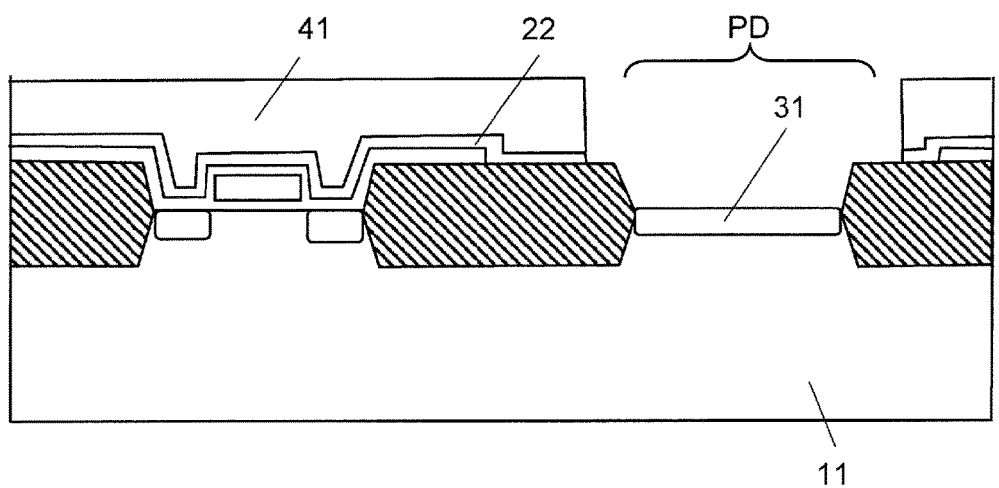
Figure 6B:
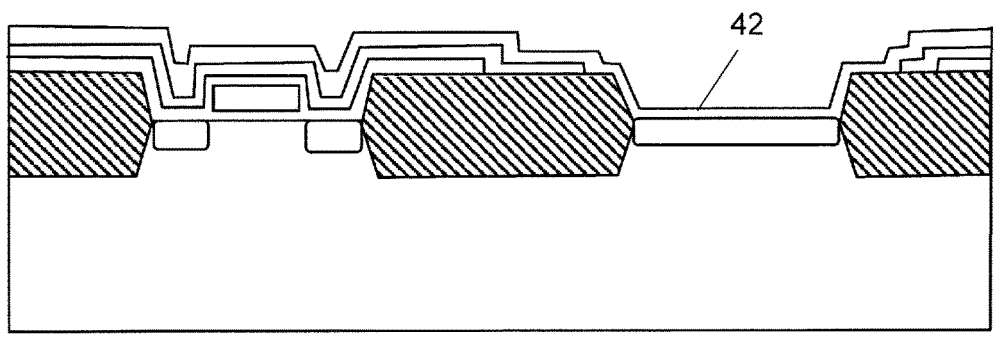
Figure 6C:
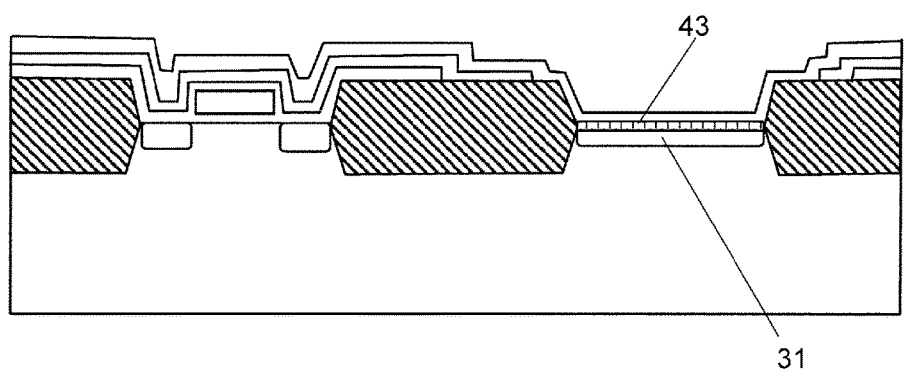

FIG. 6A to FIG. 6C are cross-sectional schematic diagrams for illustrating the representative steps of the method of manufacturing a semiconductor device including the photodiode according to the third embodiment. The third embodiment has the same steps as those of the second embodiment up to FIG. 5A. Hence, FIG. 6A is the cross-sectional schematic diagram of a step subsequent to FIG. 5A.

FIG. 6A is an illustration in which the first oxide 22, which is used as a phosphorus diffusing source, is removed in the region PD. In this step, a resist 41 is patterned so that the region PD becomes an opening portion, and the first oxide 22, which is used as the phosphorus diffusing source for forming the first n-type diffusion region 31 in the region PD in FIG. 5A, is removed by etching using the patterned resist 41 as a mask. The surface of the silicon substrate 11 is exposed again.

FIG. 6B is the cross-sectional schematic diagram of a step subsequent to FIG. 6A. FIG. 6B is an illustration in which after the photoresist 41 is removed, the second oxide 42 containing phosphorus at high concentration is deposited on the entire surface of the substrate again. For example, a silicon oxide containing phosphorus at high concentration is deposited by 0.1 μm. The concentration of phosphorus is set to $5 \times 10^{19}$ cm$^{-3}$ or more. Required time is about 30 minutes at a reaction temperature of 600° C. The deposited second oxide 42 is a deposition containing dopant to be diffused into the silicon substrate 11, and is not necessarily thin but may be deposited sufficiently.

FIG. 6C is the cross-sectional schematic diagram of a step subsequent to FIG. 6B. FIG. 6C is an illustration of the step of forming the second n-type diffusion region 43 having a shallow diffusion depth by diffusing the phosphorus into the surface of the first n-type diffusion region 31 formed on the silicon substrate 11, from the second oxide 42 containing phosphorus at high concentration. In order to diffuse the phosphorus into a very shallow region, the second high-speed annealing is performed at a high temperature of 1,000° C. or more for a time of 10 seconds or less, which is shorter than that of the first high-speed annealing. The temperature and time of the second high-speed annealing are 1,000° C. and 2 seconds, for example. Hence the second n-type diffusion region 43 can be formed to have a shallow depth at the surface of the first n-type diffusion region 31. The first diffusion region 31 and the second diffusion region 43 are overlapped in a plan view, forming a cathode region of the photodiode.

Through the process described above, there can be manufactured the photodiode having a shallow junction in which the concentration of impurities is high immediately under the surface of the silicon substrate 11. In the third embodiment, the intermediate insulating film 15 and the first oxide 22 formed on the surface in the region PD are removed by etching, and the second oxide 42, which is deposited last, remains. The intermediate insulating film 15, the first oxide 22, and the second oxide 42 are not removed in the region TR, and the MOS transistor is thus less affected.

What is claimed is:

1. A method of manufacturing a semiconductor device having a photodiode of a p-n junction in a surface of a silicon substrate, the method comprising:
   removing an oxide film formed on the surface of the silicon substrate;
   depositing a first oxide containing phosphorus on the surface of the silicon substrate;
   forming the first oxide on a surface region of the silicon substrate;
   forming a first n-type diffusion region by performing a first annealing on the first oxide at a high temperature of 1,000° C. or more for 3 minutes or less, to thereby thermally diffuse the phosphorus contained in the first oxide into the surface of the silicon substrate;
   depositing a second oxide containing phosphorus directly in contact with the surface first n-type diffusion region in the silicon substrate after removing the first oxide;
   forming the second oxide so that the second oxide is connected to the first n-type diffusion region; and
   forming a second n-type diffusion region by performing a second annealing on the second oxide to connect to the first n-type diffusion region, the second annealing at a temperature equal to or higher than that of the first annealing for a time equal to or shorter than that of the first annealing, to thereby thermally diffuse the phosphorus contained in the second oxide into the surface of the silicon substrate.

2. A method of manufacturing a semiconductor device according to claim 1, wherein each of the first oxide and the second oxide comprises a silicon oxide.

3. A method of manufacturing a semiconductor device according to claim 1, wherein the first n-type diffusion region and the second n-type diffusion region overlap each other to form a cathode region of the photodiode.

4. A method of manufacturing a semiconductor device according to claim 1, wherein the first oxide contains the phosphorus at $10^{19}$ cm$^{-3}$ or more, and the second oxide contains the phosphorus at $5 \times 10^{19}$ cm$^{-3}$ or more.

5. A method of manufacturing a semiconductor device according to claim 1, wherein the temperature of the second annealing is equal to or higher than 1,000° C. and the time for the second annealing is equal to or shorter than 10 seconds.

6. A method of manufacturing a semiconductor device having a photodiode of a p-n junction in a surface of a silicon substrate, the method comprising:
   forming an oxide film on an entire surface of the silicon substrate;
   exposing a surface area of the silicon substrate, by selectively removing the oxide film in a photodiode forming region;

depositing a first oxide containing phosphorus on the entire surface of the silicon substrate so that the first oxide is directly in contact with the exposed surface of the silicon in the photodiode forming region;

forming a first n-type diffusion region by performing first annealing on the first oxide at a high temperature of 1,000° C. or more for 3 minutes or less, to thereby thermally diffuse the phosphorus contained in the first oxide into the surface area of the silicon substrate;

exposing the surface area of the silicon substrate, in the photodiode forming region by selectively removing the first oxide;

depositing a second oxide containing phosphorus on the entire surface of the silicon substrate so that the second oxide is directly in contact with the exposed surface area in the photodiode forming region; and forming a second n-type diffusion region on a surface of the first n-type diffusion region by performing a second annealing on the second oxide at a temperature equal to or higher than that of the first annealing for a time equal to or shorter than that of the first annealing, to thereby thermally diffuse the phosphorus contained in the second oxide into the surface area of the silicon substrate.

7. A method of manufacturing a semiconductor device according to claim 6, wherein each of the first oxide and the second oxide comprises a silicon oxide.

8. A method of manufacturing a semiconductor device according to claim 6, wherein the first n-type diffusion region and the second n-type diffusion region overlap each other to form a cathode region of the photodiode.

9. A method of manufacturing a semiconductor device according to claim 6, wherein the first oxide contains the phosphorus at $10^{19}$ cm$^{-3}$ or more, and the second oxide contains the phosphorus at $5 \times 10^{19}$ cm$^{-3}$ or more.

10. A method of manufacturing a semiconductor device according to claim 6, wherein the temperature of the second annealing is equal to or higher than 1,000° C. and the time for the second annealing is equal to or shorter than 10 seconds.

11. A method of manufacturing a semiconductor device having a photodiode of a p-n junction in a surface of a silicon substrate, the method comprising:

forming an oxide film on an entire surface of the silicon substrate;

exposing a surface area of the silicon substrate, by selectively removing the oxide film in a photodiode forming region;

depositing a first oxide containing phosphorus on the entire surface of the silicon substrate so that the first oxide is directly in contact with the exposed surface area in the photodiode forming region;

forming a first n-type diffusion region by performing first annealing on the first oxide at a high temperature of 1,000° C. or more for 3 minutes or less, to thereby thermally diffuse the phosphorus contained in the first oxide into the surface area of the silicon substrate;

introducing phosphorus into the first oxide by ion implantation; and forming a second n-type diffusion region on a surface of the first n-type diffusion region by performing a second annealing on the first oxide, into which the phosphorus is introduced, at a temperature equal to or higher than that of the first annealing for a time equal to or shorter than that of the first annealing, to thereby thermally diffuse the phosphorus contained in the first oxide into the surface area of the silicon substrate.

12. A method of manufacturing a semiconductor device according to claim 11, wherein the temperature of the second annealing is equal to or higher than 1,000° C. and the time for the second annealing is equal to or shorter than 10 seconds.

* * * * *